(12) United States Patent
Huang et al.

(10) Patent No.: US 11,776,822 B2
(45) Date of Patent: Oct. 3, 2023

(54) WET CLEANING OF ELECTROSTATIC CHUCK

(71) Applicant: Applied Materials, Inc., Santa Clara, CA (US)

(72) Inventors: Tuochuan Huang, Saratoga, CA (US); Gang Peng, Fremont, CA (US); David W. Groechel, Los Altos Hills, CA (US); Vijay D. Parkhe, San Jose, CA (US); Shinnosuke Kawaguchi, Tokyo (JP); David Benjaminson, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 17/051,071

(22) PCT Filed: May 2, 2019

(86) PCT No.: PCT/US2019/030477
§ 371 (c)(1),
(2) Date: Oct. 27, 2020

(87) PCT Pub. No.: WO2019/231609
PCT Pub. Date: Dec. 5, 2019

(65) Prior Publication Data
US 2021/0249280 A1    Aug. 12, 2021

Related U.S. Application Data

(60) Provisional application No. 62/677,593, filed on May 29, 2018.

(51) Int. Cl.
*H01L 21/67* (2006.01)
*B08B 3/12* (2006.01)
*H01L 21/683* (2006.01)

(52) U.S. Cl.
CPC .......... *H01L 21/67028* (2013.01); *B08B 3/12* (2013.01); *H01L 21/6831* (2013.01)

(58) Field of Classification Search
CPC .. H01L 21/67028; H01L 21/6831; B08B 3/12
See application file for complete search history.

(56) References Cited

U.S. PATENT DOCUMENTS 6,170,496 B1 * 1/2001 Chen ...................... B08B 5/02
134/22.12
7,052,553 B1 * 5/2006 Shih ........................ B08B 3/12
134/28

(Continued)

FOREIGN PATENT DOCUMENTS

JP    H09-283485 A    10/1997
JP    H09-283486 A    10/1997

OTHER PUBLICATIONS

International Search Report and Written Opinion dated Aug. 9, 2019 for International Application No. PCT/US2019/030477.

*Primary Examiner* — Alexander Markoff
(74) *Attorney, Agent, or Firm* — Patterson + Sheridan, LLP

(57) ABSTRACT

Embodiments described herein relate a cleaning fixture and method to prevent chemical solutions from contacting the various substrate supporting member features and penetrating into the holes and the metal plate of the substrate supporting surface. The cleaning fixture includes a mounting plate having a plurality of thru-holes arranged on a bolt circle and configured to align with a plurality of thread holes disposed in an electrostatic chuck, a recess formed in the mounting plate, and a gas port formed through the mounting plate. A sealed plenum is formed between the recess of the mounting plate and a lower surface of the electrostatic chuck (Continued)

when the electrostatic chuck is coupled to the mounting plate. The gas port is fluidly coupled to the sealed plenum.

14 Claims, 3 Drawing Sheets

(56) References Cited

U.S. PATENT DOCUMENTS

| | | | | |
|---|---|---|---|---|
| 7,648,582 | B2* | 1/2010 | Steger | B08B 3/12 134/1 |
| 7,727,863 | B1 | 6/2010 | Buckalew et al. | |
| 7,754,609 | B1* | 7/2010 | Tan | B08B 3/08 438/905 |
| 7,767,028 | B2* | 8/2010 | Augustino | C23C 14/564 134/28 |
| 7,789,969 | B2* | 9/2010 | Rabinovich | C23C 16/4407 134/22.12 |
| 2003/0136428 | A1* | 7/2003 | Krogh | C23C 14/564 134/28 |
| 2006/0138081 | A1* | 6/2006 | Huang | H01J 37/32605 156/345.43 |
| 2006/0141787 | A1* | 6/2006 | Ren | B08B 3/08 438/689 |
| 2008/0099054 | A1* | 5/2008 | Rabinovich | C23C 16/4407 134/22.12 |
| 2008/0223401 | A1* | 9/2008 | Augustino | C23C 16/4405 134/59 |
| 2008/0236620 | A1* | 10/2008 | Shih | B08B 3/12 134/28 |
| 2009/0321018 | A1* | 12/2009 | Augustino | H01L 21/67069 156/345.43 |
| 2009/0325320 | A1* | 12/2009 | Avoyan | H01J 37/32862 257/E21.224 |
| 2011/0308732 | A1* | 12/2011 | La Croix | H01J 37/32532 156/345.1 |
| 2015/0165492 | A1 | 6/2015 | Avoyan et al. | |

* cited by examiner

WET CLEANING OF ELECTROSTATIC CHUCK

BACKGROUND

Field

Embodiments of the disclosure generally relate to electrostatic chucks used in semiconductor manufacturing. More particularly, embodiments of the present disclosure relate to apparatuses and methods to clean electrostatic chucks.

Description of the Related Art

Substrate supporting members are commonly used in semiconductor manufacturing to support a substrate in a processing position. One example of a substrate supporting member is an electrostatic chuck (ESC). An ESC is used to support and securely hold a substrate in a processing position, within a processing volume of a processing chamber, by means of an electrostatic chucking force. The ESC has a ceramic plate and a metal plate, also known as a cooling plate, having a fluid channel formed within so that fluid circulated through the fluid channel controls the temperature of the ceramic plate. The ESC further include holes formed through the ceramic plate and the metal plate, such as gas holes and lift pin holes, and an electrical pole connected to one or more electrodes disposed in the ceramic plate that accumulate charge to hold a substrate to the ceramic plate. The ceramic plate of the ESC accumulates by-product buildup, necessitating replacement or thorough cleaning.

Conventional cleaning processes utilize a chemical bath or wet chemical wipe to clean the ceramic plate of the ESC. During the conventional cleaning processes, the holes and electrical poles formed on or in the ESC are masked to prevent of chemical solutions from contacting the electrical poles and penetrating into the holes and embedded metal plates. As newly developed ESC's require more features, which include holes, embedded metal plates and electrical poles, the need to prevent chemical solutions from contacting undesirable portions of these features increases. Accordingly, there is a need for cleaning fixture and method to prevent chemical solutions from contacting the various ESC features (e.g., electrical poles) and penetrating into the holes and the metal plate of ESC substrate supporting members.

SUMMARY

In one embodiment, a cleaning fixture that is configured to allow a substrate supporting surface of a substrate supporting member to be cleaned during a cleaning process is provided. The cleaning fixture includes a mounting plate and shafts that extend from a bottom surface of the mounting plate. The shafts and the mounting plate are inert to a chemical solution that is exposed to the substrate supporting surface of the substrate supporting member during the cleaning process. A recess formed in the mounting plate. A sealed plenum is formed at least partially between a bottom surface of the mounting plate and a lower surface of the substrate supporting member when the substrate supporting member is coupled to the mounting plate. The lower surface is on a side of the substrate supporting member that is opposite to the substrate supporting surface. A gas port formed through the mounting plate, wherein the gas port is fluidly coupled to the sealed plenum.

In another embodiment, a method of cleaning a substrate supporting surface of a substrate supporting member is provided. The method includes forming a sealed plenum by coupling the substrate supporting member to a mounting plate of a cleaning fixture. The sealed plenum is formed between a surface of a recess of the mounting plate and a lower surface of the substrate supporting member. The lower surface is on a side of the substrate supporting member that is opposite to the substrate supporting surface. Gas is delivered through a gas port coupled to the sealed plenum to achieve a plenum pressure in the sealed plenum, a gas flow across a width of the lower surface of the substrate supporting member, and a gas flow through a plurality of holes disposed through the substrate supporting member. The substrate supporting surface of the substrate supporting member is cleaned with a chemical solution without the chemical solution penetrating into the plurality of holes and contacting features of the substrate supporting member.

In yet another embodiment, a method of cleaning a substrate supporting surface of a substrate supporting member is provided. The method includes forming a sealed plenum by coupling the substrate supporting member to a mounting plate of a cleaning fixture. The sealed plenum is formed between a surface of a recess of the mounting plate and a lower surface of the substrate supporting member. The lower surface is on a side of the substrate supporting member that is opposite to the substrate supporting surface. Gas is delivered through a gas port coupled to the sealed plenum to achieve a plenum pressure in the sealed plenum, a gas flow across a width of the lower surface of the substrate supporting member, and a gas flow through a plurality of holes disposed through the substrate supporting member. The substrate supporting surface of the substrate supporting member is cleaned with a chemical solution without the chemical solution penetrating into the plurality of holes and contacting features of the substrate supporting member. The mounting plate is inert to the chemical solution.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate a cleaning fixture and method to prevent chemical solutions from contacting the various features of a substrate support member and penetrating into the holes and the metal plate of the substrate support member. In some embodiments, the substrate support member includes an electrostatic chuck. The cleaning fixture includes one or more seals, a mounting plate having a plurality of thru-holes arranged on a bolt circle configured to align with a plurality of thread holes disposed in a substrate support member, a recess formed in the mounting plate, and a gas port formed through the mounting plate. A sealed plenum is formed between the recess of the mounting plate, the one or more seals, and a lower surface of the substrate support member when the substrate support member is coupled to the mounting plate. The gas port is fluidly coupled to the sealed plenum. While the discussion provided below primarily discusses the use of a cleaning fixture used to clean one or more surfaces of an electrostatic chuck this configuration is not intended to limit the scope of the disclosure provided herein.

Figure 1A:
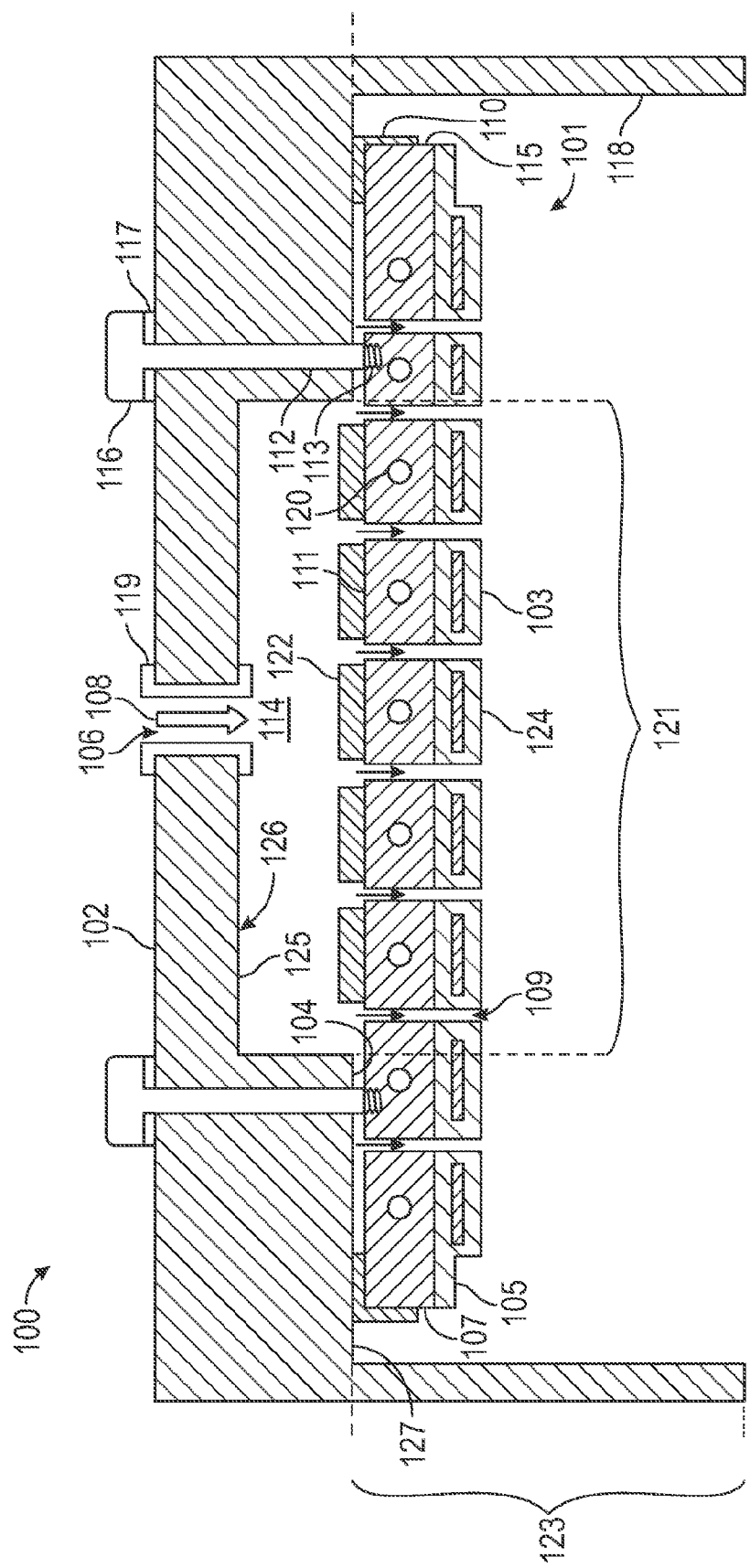
FIG. 1A is a schematic cross-sectional view of a cleaning fixture according to an embodiment.
Figure 1B:
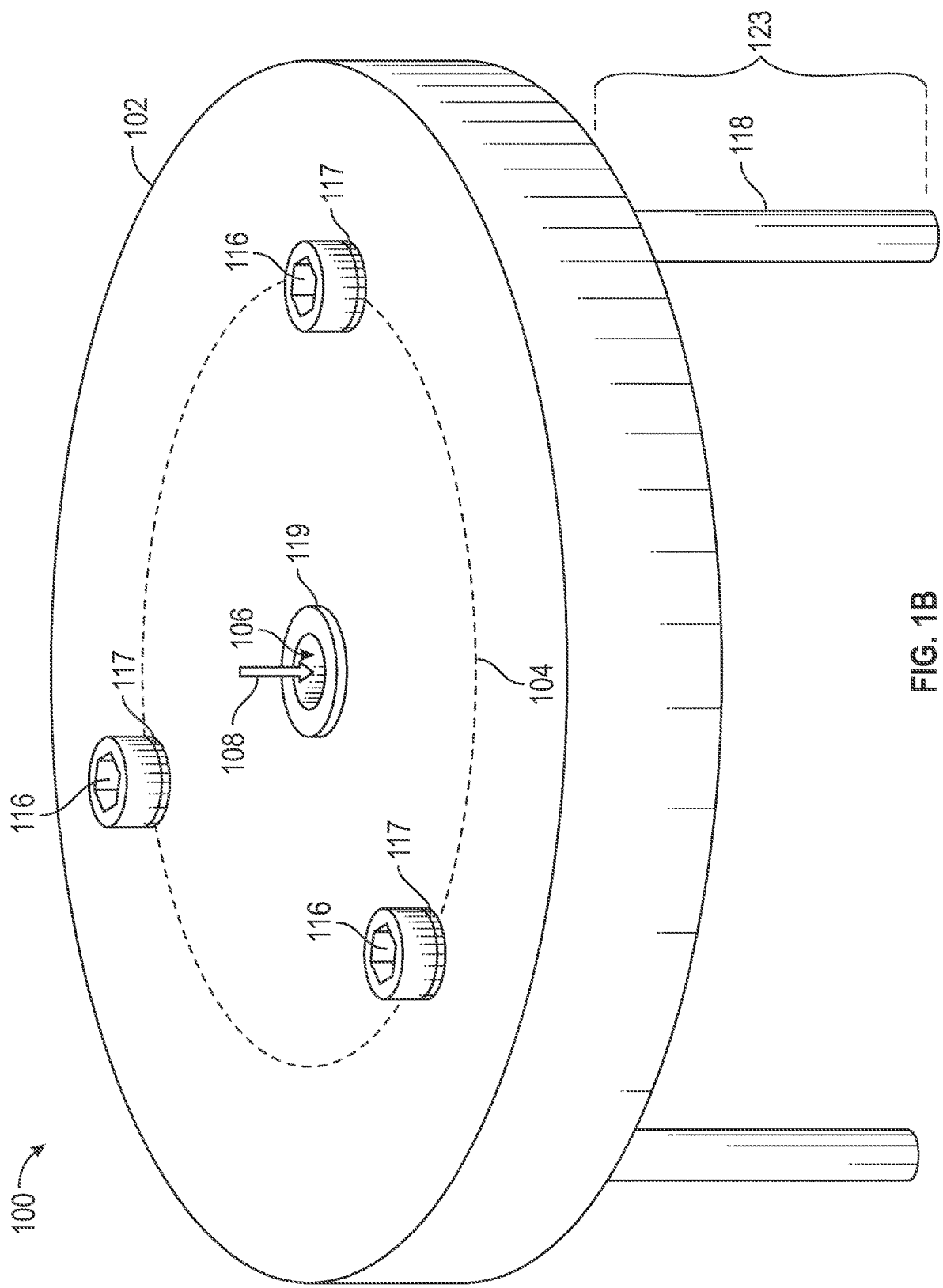
FIG. 1B is a schematic perspective view of a cleaning fixture according to an embodiment.

FIG. 1A is a schematic cross-sectional view of a cleaning fixture 100. FIG. 1B is a schematic perspective view of the cleaning fixture 100. It is to be understood that the cleaning fixture described below is an exemplary cleaning fixture and other cleaning fixtures, including cleaning fixtures from other manufacturers, may be used with or modified to accomplish aspects of the present disclosure.

The cleaning fixture 100 includes shafts 118 that support a mounting plate 102. The shafts 118 extend from a bottom surface 127 of the mounting plate. In one embodiment, which can be combined with other embodiments described herein, the shafts 118 and the mounting plate 102 are a single body. In another embodiment, which can be combined with other embodiments described herein, the shafts 118 and the mounting plate 102 are separate bodies and the shafts 118 are coupleable to the mounting plate 102. In yet another embodiment, which can be combined with other embodiments described herein, the shafts 118 and the mounting plate 102 include materials that are inert to chemical solutions that are provided to a substrate supporting surface of a substrate supporting member during processing. For example, the substrate supporting member is an electrostatic chuck (ESC) 101 having a ceramic plate 105 with an upper surface 103 to support a substrate. The materials of the shafts 118 and the mounting plate 102 may include plastics, such as polytetrafluoroethylene (PTFE), polyvinylidene difluoride (PVDF), or ceramic materials (e.g., quartz, alumina), inert to chemical solutions to be exposed to the upper surface 103 of the ESC 101. The materials of the shafts 118 and the mounting plate 102 may be transparent such that the ESC 101 is visible when secured to the mounting plate 102. A length 123 of the shafts 118 provides for support of the mounting plate 102 and allows for machine tools, hands, and chemical baths to access the upper surface 103 of the ESC 101.

The mounting plate 102 has a plurality of thru-holes 112 arranged on a bolt circle 104. The bolt circle 104 is configured to align with a plurality of thread holes 113 formed in the ESC 101. The ESC 101 includes an upper surface 103, a lower surface 111, and a plurality of holes 109 disposed through the upper surface 103 and the lower surface 111. During use the ESC 101 is secured to the mounting plate 102 by screws 116 disposed through the plurality of thru-holes 112 and thread holes 113. In one embodiment, which can be combined with other embodiments described herein, the ESC 101 is secured to a pedestal of a processing chamber by screws disposed through the thread holes 113. The mounting plate 102 further includes a recess 125. A sealed plenum 114 is formed at least partially between a surface 126 of the recess 125 of the mounting plate 102 and a lower surface 111 of the ESC 101 when the ESC 101 is coupled to the mounting plate 102. One or more seals 110 coupled to the bottom surface 127 of the mounting plate 102 may be used to further seal the sealed plenum 114. Seals 117, which are disposed between each of the screws 116 and a surface of the mounting plate, may also be used to further seal the sealed plenum 114. In one embodiment, which can be combined with other embodiments described herein, the seals 110 and the seals 117 are fluoropolymer elastomer seals (e.g., Viton® rubber seals).

A gas port 106 connected to the sealed plenum 114 is formed through the cleaning fixture 100. In one embodiment, which can be combined with other embodiments described herein, the gas port 106 includes an adaptor 119, such as a seal, for connection to a gas line of a gas source to provide a flow of gas 108 to the sealed plenum 114. The sealed plenum 114, sealed by the seals 110, seals 117, and adaptor 119, allows the flow of gas 108 through the gas port 106 to distribute across the width of the surface of the ESC 101 that is exposed to the sealed plenum 114 so that the gas 108 flows through a plurality of holes 109 disposed through the ESC 101. In one embodiment, which can be combined with other embodiments described herein, the each hole of the plurality of holes 109 has a diameter less than about 0.09 inches (inch), such as gas holes. Holes having a diameter greater than about 0.09 inch, such as lift pin holes having a diameter of about 0.09 inch to about 0.4 inch, are masked. For example, a rubber pole is disposed through each lift pin hole. In one embodiment, rubber poles are used to plug 3 lift pin holes. In some configurations, the ESC 101 includes a ceramic plate 105 that includes the upper surface 103 and a metal plate 107 that includes the lower surface 111. The plurality of holes 109 are disposed through the ceramic plate 105 and the metal plate 107.

The metal plate 107 can be used to form a cooling base that contains aluminum (Al) or steel materials having a fluid channel 120 disposed within the metal plate 107 so that fluid circulated through the fluid channel 120 controls the temperature of the ceramic plate 105 during subsequent substrate processing steps. The metal plate 107 includes one or more features 122. In one embodiment, which can be combined with other embodiments described herein, the features are coupled to the lower surface 11 of the metal plate 107. One of the features 122 may be an electrical pole connected to one or more electrodes 124 configured to accumulate charge to hold a substrate to the upper surface 103 of the ceramic plate 105. Another of the features 122 may be a connection to the fluid channel 120 to be connected to a heat exchanger of a fluid source. A diameter 121 of the recess 125 is selected such that each of the one or more features 122 is disposed in the recess 125 when the ESC 101 is coupled to the mounting plate 102.

The ESC 101 is coupled to the mounting plate 102 such that the sealed plenum 114 is formed between the surface 126 of the recess 125 of the mounting plate 102, the one or more seals 110, and the lower surface 111 of the ESC 101. The lower surface 111 is exposed to the sealed plenum 114. Exposing the lower surface 111 of the metal plate 107 to the sealed plenum 114 allows for the upper surface 103 of the ceramic plate 105 to be cleaned with chemical solutions without the chemical solutions penetrating through the plurality of holes 109 and contacting the metal plate 107 and the features 122. If chemical solutions penetrate through the plurality of holes 109 and contact the metal plate 107 and the features 122, the metal plate 107 and the features 122 will be etched and irreparably damaged. Furthermore, the lower surface 111 of the metal plate 107 is exposed to the sealed plenum 114 for a downward flow of gas 108. Having a facedown orientation will prevent the penetration of chemical solutions through the plurality of holes 109 due to gravity. To prevent the penetration of chemical solutions through the plurality of holes 109 an upward flow of the gas 108 will require a higher pressure than the downward flow of the gas 108. With a lower pressure less cleaning fluid is dispersed off the upper surface 103 during cleaning processes.

Figure 2:
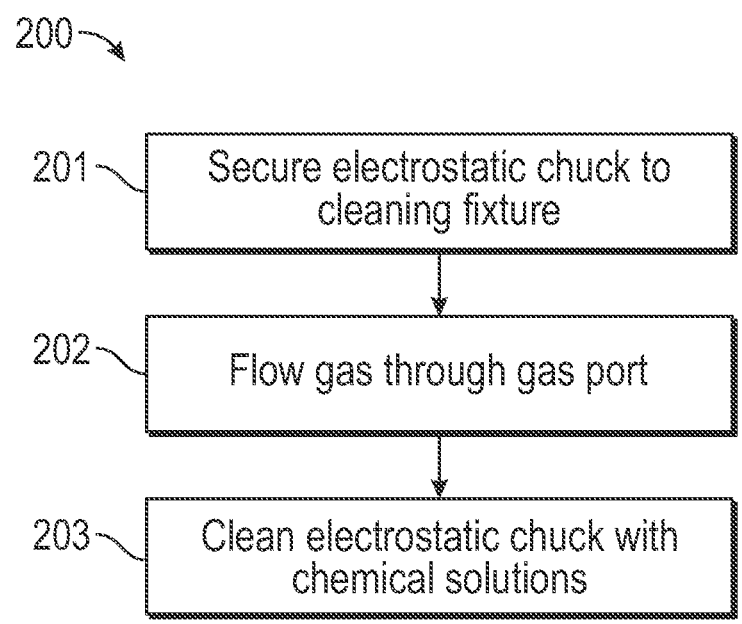
FIG. 2 is a flow diagram illustrating operations of a method for cleaning an electrostatic chuck according to an embodiment.

FIG. 2 is a flow diagram illustrating operations of a method 200 for cleaning an ESC 101. At operation 201, the ESC 101 is secured to the cleaning fixture 100 with the lower surface 111 exposed to the plenum 114. A sealed plenum 114 is formed when the ESC 101 is coupled to the mounting plate 102 by the one or more seals 110, the surface 126 of the recess 125 of the mounting plate 102, and the lower surface 111 of the ESC 101.

At operation 202, a flow of gas 108 is delivered through the gas port 106 to achieve a plenum pressure. In one embodiment, which can be combined with other embodiments described herein, the plenum pressure of about 10 psi to about 20 psi and the gas 108 is an inert gas such as nitrogen ($N_2$) gas. During operation 202, the gas 108 distributes across the width of the lower surface 111 so that the gas 108 flows through the plurality of holes 109.

At operation 203, the upper surface 103 of the ESC 101 is cleaned with chemical solutions. The flow of gas 108 through the plurality of holes 109 allows the upper surface 103 of the ceramic plate 105 to be cleaned without chemical solutions penetrating into the plurality of holes 109 and contacting the metal plate 107 and the features 122. Exposed portions 115 of the metal plate 107, such as portions positioned at the outer edge of the ESC 101, may be masked by the seals 110 or by use of additional masks or masking materials (not shown). During operation 203, the upper surface 103 may be wiped or soaked by the chemical solutions during the cleaning processes. In one embodiment, which can be combined with other embodiments described herein, the upper surface 103 is wiped with the chemical solutions by a machine tool or by hand. In another embodiment, the upper surface 103 is immersed in a chemical bath of the chemical solutions. The length 123 of the shafts 118 is chosen so that the gas port 108 is not exposed to the chemical solutions. The chemical solutions may include acidic or basic solutions that are able to remove the contamination formed on the upper surface 113 of the ESC 101. In one example, an acidic solution is used to remove metal contamination formed on the upper surface 113. As described above the flow of the gas 108 is downward to allow the plenum pressure of about 10 psi to about 20 psi.

At the conclusion of the method 200, cleaning processes, such as deionized (DI) water rinsing, ultrasonic cleaning, and high temperature baking, may additionally be performed on the ESC 101. The solutions used during the rinsing and ultrasonic cleaning processes can also be prevented from penetrating into the plurality of holes 109 and contacting the metal plate 107 and contacting the features 122 by delivering the gas 108 through the holes 109. During ultrasonic cleaning the upper surface 103 is immersed in a bath of solutions and an ultrasonic transducer agitates the solutions using ultrasonic energy to remove the contamination formed on the upper surface 103 of the ESC 101.

In summation, a cleaning fixture and method for a cleaning an ESC are described herein. The utilization of exposing the lower surface of the ESC to the flow of gas so that the gas flows through the plurality of holes allows the upper surface to be cleaned without chemical solutions penetrating into the plurality of holes and metal plate and contacting the electrical pole.

While the foregoing is directed to embodiments of the present disclosure, other and further embodiments of the disclosure may be devised without departing from the basic scope thereof, and the scope thereof is determined by the claims that follow.

What is claimed is:

1. A cleaning fixture that is configured to enable a substrate supporting surface of a substrate supporting member to be cleaned during a cleaning process, comprising:
    a mounting plate comprising a recessed surface and a bottom surface, the recessed surface and bottom surface disposed parallel to one another and in separate planes, the recessed surface partially defining a recess formed in the mounting plate, the recess is further defined when a lower surface of a substrate supporting member is disposed adjacent to the bottom surface of the mounting plate;
    shafts that extend from the bottom surface of the mounting plate, wherein the shafts and the mounting plate are inert to a chemical solution that is exposed to the substrate supporting surface of the substrate supporting member during the cleaning process;
    a plenum is formed between the bottom surface and the recessed surface of the mounting plate and the lower surface of the substrate supporting member, the substrate supporting member configured to be coupled to the mounting plate;
    a seal disposed between and in contact with the bottom surface of the mounting plate and the lower surface of the substrate supporting member, the seal partially sealing the plenum; and
    a gas port formed through the mounting plate, wherein the gas port is fluidly coupled to the plenum.

2. The cleaning fixture of claim 1, wherein materials of the shafts and the mounting plate are transparent such that the substrate supporting member is visible when coupled to the mounting plate.

3. The cleaning fixture of one of claim 1, wherein each of one or more features of the substrate supporting member is disposed within the recess when the substrate supporting member is coupled to the mounting plate.

4. The cleaning fixture of claim 1, wherein the mounting plate has a plurality of thru-holes arranged on a bolt circle and is configured to align with a plurality of thread holes disposed in the lower surface of the substrate supporting member.

5. The cleaning fixture of claim 4, further comprising screws disposed through the plurality of thru-holes and the plurality of thread holes configured to secure the substrate supporting member to the mounting plate with the lower surface exposed to the sealed plenum.

6. A method of cleaning an electrostatic chuck, comprising:
    forming a plenum by coupling the electrostatic chuck to a mounting plate of a cleaning fixture, the mounting plate comprising a recessed surface and a bottom surface, the recessed surface and bottom surface disposed parallel to one another and in separate planes, the recessed surface partially defining a recess formed in the mounting plate,
        wherein the plenum is formed between the bottom surface and the recessed surface of the mounting plate, wherein a lower surface of the electrostatic chuck is on a side of the electrostatic chuck that is opposite to a substrate supporting surface, wherein the plenum is partially sealed by a seal disposed between and in contact with the bottom surface of the mounting plate and the lower surface of the electrostatic chuck;

delivering gas through a gas port coupled to the plenum to achieve a plenum pressure in the plenum, a gas flow across a width of the lower surface of the electrostatic chuck, and a gas flow through a plurality of holes disposed through the electrostatic chuck; and cleaning the substrate supporting surface of electrostatic chuck with a chemical solution without the chemical solution penetrating into the plurality of holes and contacting features of the substrate supporting member.

7. The method of claim 6, wherein the cleaning the electrostatic chuck with the chemical solution comprises at least one of wiping the substrate supporting surface with the chemical solution and immersing the substrate supporting surface in a chemical bath of the chemical solution.

8. The method of claim 7, wherein a length of shafts supporting the mounting plate allows for at least one of a machine tool, a hand, and the chemical bath to access the substrate supporting surface of the electrostatic chuck.

9. The method of claim 7, wherein materials of the shafts and the mounting plate are inert to the chemical solution.

10. The method of claim 7, wherein materials of the shafts and the mounting plate are transparent.

11. The method of claim 6, further comprising performing deionized (DI) water rinsing, ultrasonic cleaning, or high temperature baking after the cleaning the electrostatic chuck.

12. The method of claim 6, wherein the coupling the electrostatic chuck to the mounting plate includes disposing screws through a plurality of thru-holes of the cleaning fixture and a plurality of thread holes in the electrostatic chuck.

13. The method of claim 6, wherein the plenum pressure is about 10 psi to about 20 psi.

14. A method of cleaning a surface of an electrostatic chuck, comprising:

forming a plenum by coupling the electrostatic chuck to a mounting plate of a cleaning fixture, the mounting plate comprising a recessed surface and a bottom surface, the recessed surface and bottom surface disposed parallel to one another and in separate planes, the recessed surface partially defining a recess formed in the mounting plate, wherein the plenum is formed between the bottom surface and the recessed surface of the mounting plate, wherein a lower surface of the electrostatic chuck is on a side of the electrostatic chuck that is opposite to a substrate supporting surface, wherein the plenum is partially sealed by a seal disposed between and in contact with the bottom surface and the lower surface of the electrostatic chuck;

delivering gas through a gas port coupled to the plenum to achieve a plenum pressure in the plenum, a gas flow across a width of the lower surface of the electrostatic chuck, and a gas flow through a plurality of holes disposed through the electrostatic chuck; and cleaning the substrate supporting surface of the electrostatic chuck with a chemical solution without the chemical solution penetrating into the plurality of holes and contacting features of the electrostatic chuck, wherein the mounting plate is inert to the chemical solution.

\* \* \* \* \*